United States Patent
Sandhu et al.

(10) Patent No.: US 6,531,352 B1
(45) Date of Patent: Mar. 11, 2003

(54) METHODS OF FORMING CONDUCTIVE INTERCONNECTS

(75) Inventors: Gurtej S. Sandhu, Boise, ID (US); Trung Tri Doan, Boise, ID (US); Howard E. Rhodes, Boise, ID (US); Sujit Sharan, Boise, ID (US); Philip J. Ireland, Nampa, ID (US); Martin Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 09/653,151

(22) Filed: Aug. 31, 2000

(51) Int. Cl.⁷ .......................................... H01L 21/8238
(52) U.S. Cl. ...................... 438/200; 438/674
(58) Field of Search ................. 438/200, 592, 438/639, 643, 655, 656, 674, 675, 680, 775, 153, 589, 653

(56) References Cited

U.S. PATENT DOCUMENTS 6,245,674 B1 * 6/2001 Sandhu
2002/0019127 A1 * 2/2002 Givens

* cited by examiner

Primary Examiner—David Nelms
Assistant Examiner—Phuc T. Dang
(74) Attorney, Agent, or Firm—Wells St. John P.S.

(57) ABSTRACT

The invention includes a method of forming a conductive interconnect. An electrical node location is defined to be supported by a silicon-containing substrate. A silicide is formed in contact with the electrical node location. The silicide is formed by exposing the substrate to hydrogen, $TiCl_4$ and plasma conditions to cause Ti from the $TiCl_4$ to combine with silicon of the substrate to form $TiSi_x$. Conductively doped silicon material is formed over the silicide. The conductively doped silicon material is exposed to one or more temperatures of at least about 800° C. The silicide is also exposed to the temperatures of at least about 800° C.

23 Claims, 2 Drawing Sheets

METHODS OF FORMING CONDUCTIVE INTERCONNECTS

TECHNICAL FIELD

The invention pertains to methods of forming conductive interconnects.

BACKGROUND OF THE INVENTION

Conductive interconnects are frequently used for connecting portions of integrated circuitry. Conductive interconnects can extend either vertically or horizontally, depending on their particular application. For instance, vertically extending conductive interconnects (conductive plugs) can be utilized for connecting circuitry at one elevational level with an electrical node at a different elevational level. An exemplary prior art conductive plug is described with reference to a semiconductive wafer fragment 10 in FIG. 1.

Wafer fragment 10 comprises a substrate 12, and an insulative material 14 overlying substrate 12. Substrate 12 can comprise, for example, monocrystalline silicon lightly doped with a p-type conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Insulative material 14 can comprise, for example, borophosphosilicate glass (BPSG).

An electrical node 16 is supported by substrate 12, with node 16 being at an electrical node location of substrate 12. In the shown structure, electrical node 16 comprises a diffusion region formed within substrate 12. Such diffusion region can be formed by implanting a conductivity-enhancing dopant within substrate 12 to a concentration which creates the electrically conductive region 16.

An opening 20 extends through insulative layer 14 and to electrical node 16. A silicide layer 22 is provided at a bottom of opening 20 and over electrical node 16, a titanium nitride barrier layer 21 is formed over silicide layer 22, and a conductive plug 24 is provided over silicide material 22. Conductive plug 24 comprises a metal, such as, for example, tungsten, and can be formed by, for example, sputter deposition.

Silicide material 22 can be formed by depositing a silicide, such as, for example, titanium silicide, over electrical node 16.

A conductive material 33 is provided over insulative material 14 and in contact with plug 24. Plug 24 thus functions as a conductive interconnect between the elevationally upper circuitry of material 33 and the elevationally lower circuitry of node 16. In the shown construction, plug 24 and insulative layer 14 comprise a common and planarized upper surface 30. Such planarized upper surface can be formed by, for example, chemical-mechanical polishing.

As conductive interconnects are utilized in numerous circuitry constructions, it would be desirable to develop alternative methods of forming conductive interconnects.

SUMMARY OF THE INVENTION

In one aspect, the invention includes a method of forming a conductive interconnect. An electrical node location is defined to be supported by a silicon-containing substrate. A silicide is formed in contact with the electrical node location. The silicide is formed by exposing the substrate to hydrogen, $TiCl_4$ and plasma conditions to cause Ti from the $TiCl_4$ to combine with silicon of the substrate to form $TiSi_x$. Conductively doped silicon material is formed over the silicide. The conductively doped silicon material is exposed to one or more temperatures of at least about 800° C. The silicide is also exposed to the temperatures of at least about 800° C.

In another aspect, the invention includes another method of forming a conductive interconnect. A silicon-comprising electrical node is supported by a substrate. An insulative material is formed over the substrate. The insulative material has an opening therein which extends to the electrical node. A silicide is formed within the opening and over the electrical node. The silicide is formed by exposing the electrical node to hydrogen, $TiCl_4$ and plasma conditions to cause Ti from the $TiCl_4$ to combine with silicon of the node to form $TiSi_x$. A conductive barrier layer is formed over the silicide within the opening. A conductively doped silicon material is formed over the barrier layer within the opening. The barrier layer protects against migration of dopant from the conductively doped silicon material to the silicide.

BRIEF DESCRIPTION OF THE DRAWINGS

Preferred embodiments of the invention are described below with if reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
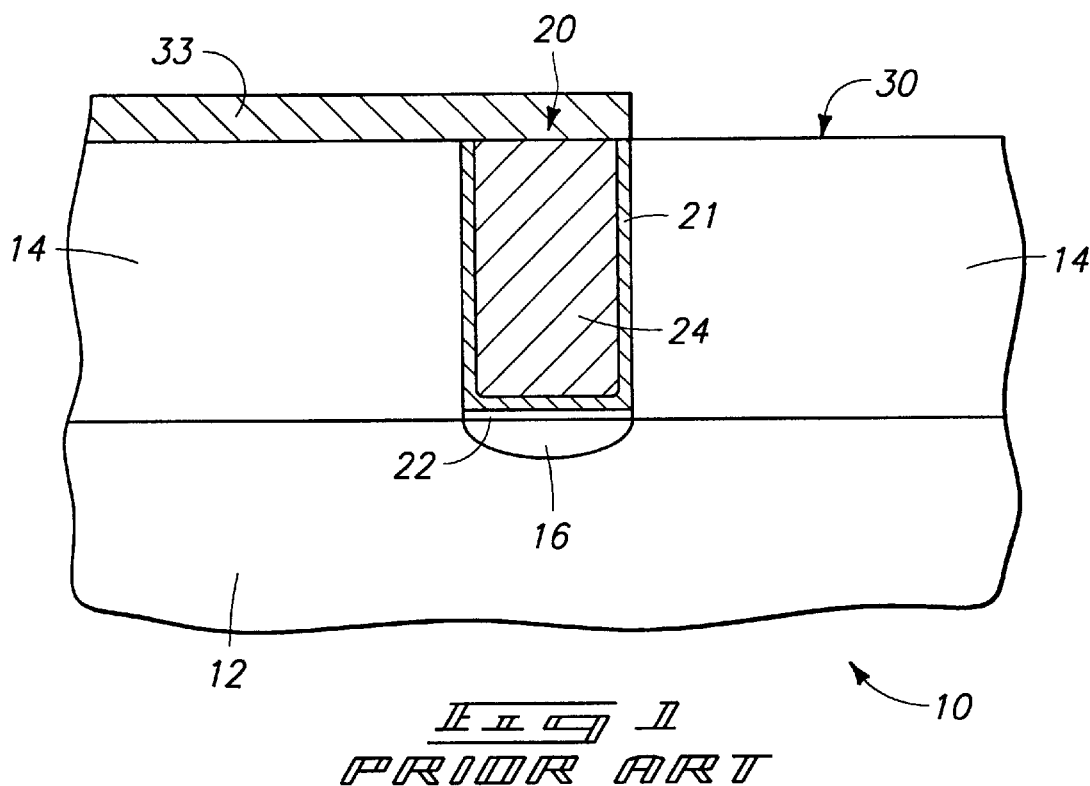
FIG. 1 is a cross-sectional, fragmentary, diagrammatic view of a prior art conductive interconnect construction.
Figure 2:
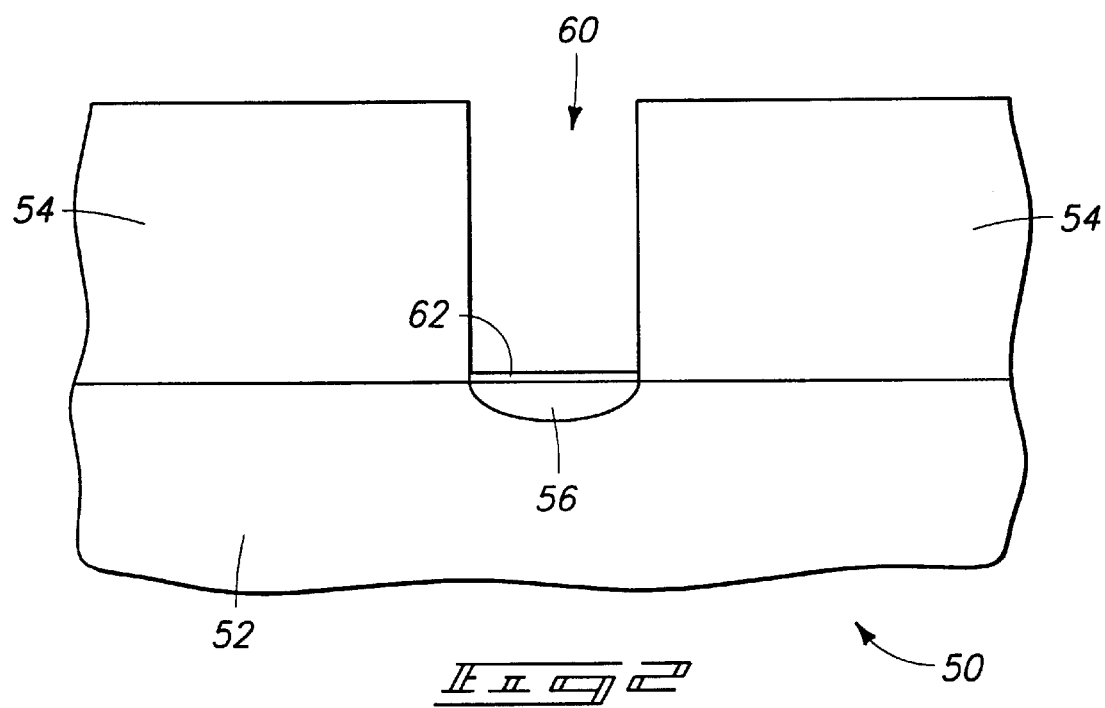
FIG. 2 is a diagrammatic, fragmentary, cross-sectional view of a semiconductive wafer fragment processed according to a method of the present invention.

A method of the present invention is described with reference to FIGS. 2–4. Referring first to FIG. 2, a semiconductive wafer fragment 50 is illustrated at a preliminary processing step. Wafer fragment 50 comprises a substrate 52 and an insulative material 54 overlying substrate 52. Substrate 52 and insulative material 54 can comprise, for example, materials described above with reference to prior art FIG. 1 as pertaining to substrate 12 and insulative material 14, respectively.

A node location 56 is supported by substrate 52. In the shown construction, node location 56 comprises a conductively doped diffusion region within semiconductive material of substrate 52. Accordingly, if substrate 52 comprises monocrystalline silicon, node location 56 also comprises silicon.

An opening 60 extends through insulative material 54 and to substrate 52, and a silicide layer 62 is formed within opening 60. Silicide material 62 is preferably formed utilizing a plasma, $TiCl_4$ and $H_2$, at a temperature greater than 550° C. and less than 770° C. A suitable temperature is, for example, 650° C., and such causes Ti from the $TiCl_4$ to combine with silicon of node location 56 to form $TiSi_x$ as the silicide material 62. In exemplary processes, the temperature of formation of the silicide does not exceed 650° C. The hydrogen can be provided in forms in addition to, or alternatively to, $H_2$, including, for example, in the forms of hydrazine and/or ammonia.

A preferred pressure range within a plasma reactor during formation of the silicide is from 0.1 mTorr to 100 Torr.

The above-described preferred method of forming silicide creates a silicide more resistant to processing temperatures above 800° C. than are silicides formed by deposition. Specifically, silicides formed by processes other than the $TiCl_4$ and $H_2$ processing described above are found to agglomerate when exposed to temperatures above 800° C. Such can be problematic, as it is frequently desirable to conduct fabrication steps after formation of the silicide that are at temperatures in excess of 800° C.

Figure 3:
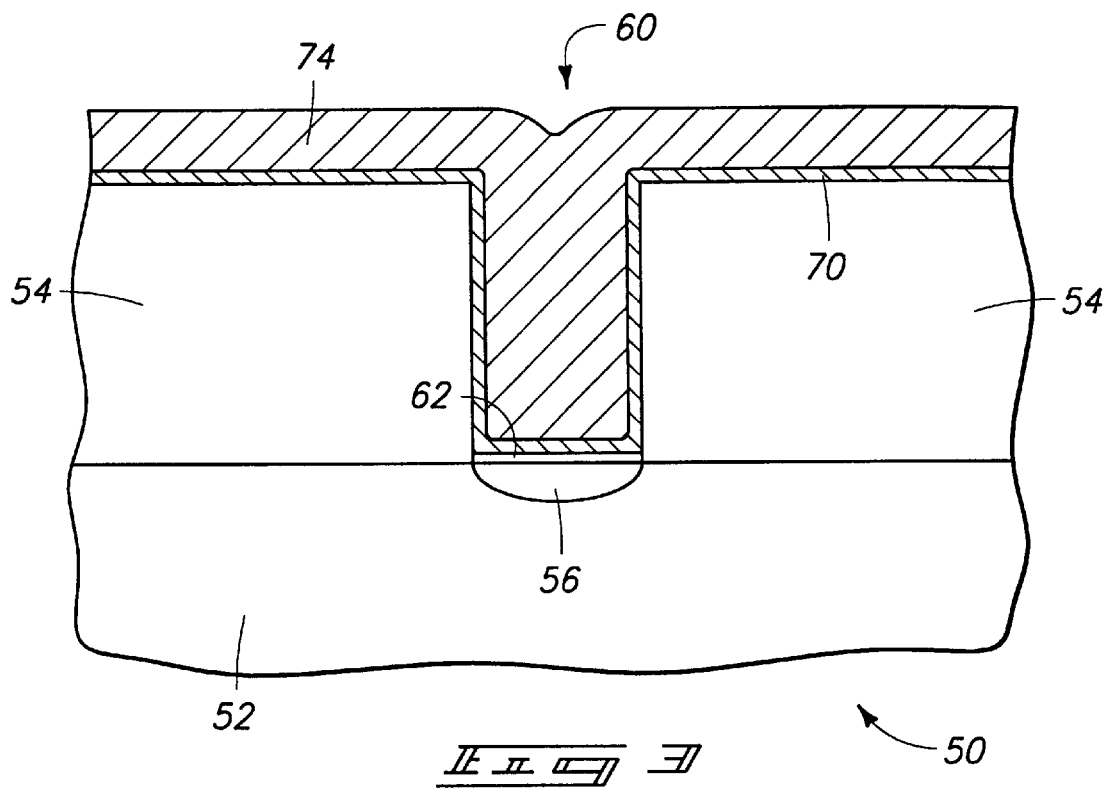
FIG. 3 is a view of the FIG. 2 wafer fragment shown at a processing step subsequent to that of FIG. 2.

Referring to FIG. 3, a conductive barrier layer 70 is formed within opening 60. Barrier layer 70 is formed to a thickness which less than completely fills opening 60. Barrier layer 70 preferably comprises a conductive material and can comprise, for example, a metal nitride, such as titanium nitride (TiN). In particular applications, barrier layer 70 can comprise one or more of TiN, TaN and WN; and can be formed by either chemical vapor deposition or sputter deposition. In an exemplary embodiment, barrier layer 70 can consist essential of TiN. Barrier layer 70 is separated from electrical node 56 by silicide layer 62. Barrier layer 70 can be formed by conventional methods such as, for example, chemical vapor deposition.

After formation of barrier layer 70, a conductively doped silicon material 74 is formed within opening 60 and over barrier layer 70. Conductively doped silicon material 74 can comprise, for example, conductively doped polysilicon. An exemplary conductively doped polysilicon is polysilicon doped to a concentration of greater than $1 \times 10^{19}$ atoms/cm$^3$ with conductivity-enhancing dopant. The conductivity-enhancing dopant can be either n-type or p-type. The dopant within silicon material 74 is preferably activated at a temperature above 800° C., such as, for example, a temperature of at least about 1000° C. As indicated previously, the preferred silicide formed from $H_2$, $TiCl_4$ and plasma is better able to withstand temperatures in excess of 800° C. than is deposited silicide, and specifically such preferred silicide is less prone to agglomeration than would be a deposited silicide.

Doped silicon material 74 is separated from silicide 62 by barrier layer 70. Barrier layer 70 is chosen to protect against dopant migrating from doped silicon material 74 into silicide material 62. In accordance with one aspect of the invention, it is recognized that dopants diffusing into silicide material 62 can diffuse through the material and into node location 56. Such dopants can adversely affect a conductivity of node location 56. For instance, if the dopants comprise an opposite conductivity type (with p-type being understood to be an opposite conductivity type of n-type, and vice versa) the dopants can undesirably reduce a conductivity of node location 56. Alternatively, if the dopants comprise a same conductivity type as node location 56 the dopants can increase a conductivity of node location 56, which can also be undesired in particular applications.

Figure 4:
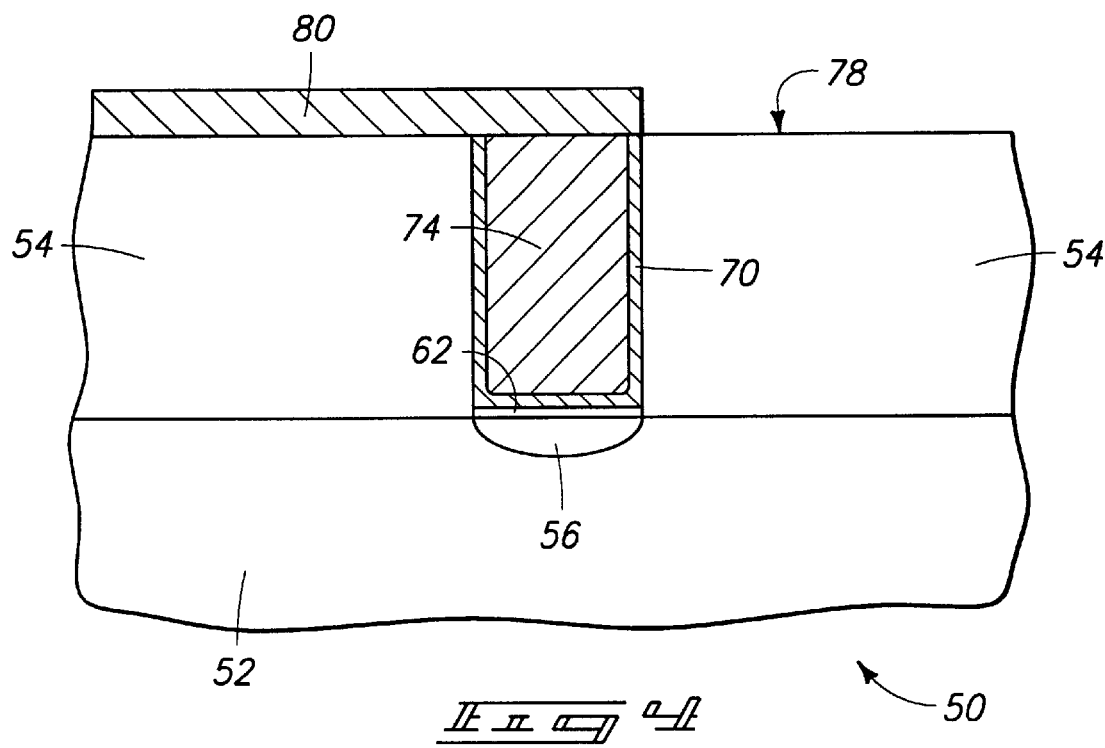
FIG. 4 is a view of the FIG. 2 wafer fragment shown at a processing step subsequent to that of FIG. 3 and illustrating a conductive interconnect construction encompassed by the present invention.

Referring next to FIG. 4, wafer fragment 50 is subjected to a planarization process to remove conductive materials 70 and 74 from over insulative material 54, and to thereby form a planar surface 78 comprising remaining upper surfaces of insulative material 54, barrier layer 70 and silicon-comprising material 74. An exemplary planarization method is chemical-mechanical polishing. In subsequent processing, a conductive material 80 is formed over planarized upper surface 78 and in electrical contact with at least one of conductive materials 70 and 74. Conductive material 80 can comprise, for example, either a metal or conductively doped polysilicon. Conductive material 80 can be formed by conventional methods, such as, for example, chemical vapor or sputter deposition and subsequent photolithographic patterning with photoresist.

In the shown structure, conductive materials 70 and 74 together form a conductive interconnect between the elevationally upper electrical node of conductive material 80 and the elevationally lower electrical node 56. Materials 70 and 74 can be referred to as a vertically extending conductive plug.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive interconnect, comprising:
   defining an electrical node location supported by a silicon-containing substrate;
   forming a silicide in contact with the electrical node location, the silicide being formed by exposing the substrate to hydrogen, $TiCl_4$ and plasma conditions to cause Ti from the $TiCl_4$ to combine with silicon of the substrate to form $TiSi_x$;
   forming a conductively doped silicon material over the silicide; and
   exposing the conductively doped silicon material to one or more temperatures of at least about 800° C.; the silicide also being exposed to the temperatures of at least about 800° C.

2. The method of claim 1 wherein silicide formation occurs in a reactor, and the hydrogen is provided in the reactor in the form of $H_2$.

3. The method of claim 1 wherein exposing of the conductively doped silicon material and silicide comprises exposing of the conductively doped silicon material and silicide to one or more temperatures of at least about 1000° C.

4. The method of claim 1 wherein the substrate is maintained at from 550° C. to 770° C. during the formation of the silicide.

5. The method of claim 1 wherein the substrate is maintained at a temperature no greater than 650° C. during the formation of the silicide.

6. The method of claim 1 further comprising:
   before forming the conductively doped silicon material, forming a conductive barrier layer over the electrical node location and separated from the electrical node location by the silicide; and
   forming the conductively doped silicon material to be separated from the silicide by the conductive barrier layer, the barrier layer impeding migration of dopant from the conductively doped silicon material to the silicide.

7. The method of claim 6 wherein the conductive barrier layer comprises one or more of TiN, WN and TaN.

8. The method of claim 6 wherein the conductive barrier layer comprises one or more of TiN, WN and TaN; and wherein the barrier layer is formed by either chemical vapor deposition or sputter deposition.

9. The method of claim 6 wherein the substrate comprises monocrystalline silicon and wherein an electrical node comprising a conductively doped diffusion region within the monocrystalline silicon is formed at the electrical node location, the conductively doped diffusion region being one of n-type or p-type and the conductively doped silicon material being the other of n-type and p-type.

10. The method of claim 1 wherein the substrate comprises monocrystalline silicon and wherein an electrical node comprising a conductively doped diffusion region within the monocrystalline silicon is formed at the electrical node location.

11. The method of claim 1 wherein the conductively doped silicon material comprises polycrystalline silicon.

12. A method of forming a conductive interconnect, comprising:
    providing a silicon-comprising electrical node supported by a substrate;
    forming an insulative material over the substrate and having an opening therein which extends to the electrical node;
    forming a silicide within the opening and over the electrical node, the silicide being formed by exposing the electrical node to hydrogen, $TiCl_4$ and plasma conditions to cause Ti from the $TiCl_4$ to combine with silicon of the node to form $TiSi_x$;
    forming a conductive barrier layer over the silicide within the opening; and
    forming a conductively doped silicon material over the barrier layer within the opening, the barrier layer protecting against migration of dopant from the conductively doped silicon material to the silicide.

13. The method of claim 12 wherein silicide formation occurs in a reactor, and the hydrogen is provided in the reactor in the form of $H_2$.

14. The method of claim 12 further comprising exposing the silicide to one or more temperatures of at least about 800° C. after formation of the conductively doped silicon material.

15. The method of claim 12 further comprising exposing the silicide to one or more temperatures of at least about 1000° C. after formation of the conductively doped silicon material.

16. The method of claim 12 wherein the electrical node is maintained at from 550° C. to 770° C. during the formation of the silicide.

17. The method of claim 12 wherein the electrical node is maintained at a temperature no greater than 650° C. during the formation of the silicide.

18. The method of claim 12 wherein the conductive barrier layer comprises a metal nitride.

19. The method of claim 12 wherein the conductive barrier layer comprises one or more of TiN, WN and TaN.

20. The method of claim 12 wherein the conductive barrier layer consists essentially of TiN.

21. The method of claim 12 wherein the substrate comprises silicon and wherein the electrical node comprises a conductively doped diffusion region within the silicon.

22. The method of claim 12 wherein the substrate comprises silicon and wherein the electrical node comprises a conductively doped diffusion region within the silicon, the conductively doped diffusion region being one of n-type or p-type and the conductively doped silicon material being the other of n-type and p-type.

23. The method of claim 12 wherein the conductively doped silicon material comprises polycrystalline silicon.

* * * * *

UNITED STATES PATENT AND TRADEMARK OFFICE
CERTIFICATE OF CORRECTION

PATENT NO. : 6,531,352 B1
DATED : March 11, 2003
INVENTOR(S) : Gurtej S. Sandhu et al.

It is certified that error appears in the above-identified patent and that said Letters Patent is hereby corrected as shown below:

<u>Column 2,</u>
Line 28, please replace "below with if reference to the following" with -- below with reference to the following --

Signed and Sealed this

Seventeenth Day of June, 2003

JAMES E. ROGAN
*Director of the United States Patent and Trademark Office*